(12) United States Patent
Lee (10) Patent No.: US 7,880,659 B2
(45) Date of Patent: Feb. 1, 2011

(54) PIPELINE ANALOG-TO-DIGITAL CONVERTER AND METHOD OF DRIVING THE SAME

(75) Inventor: Kang-Jin Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 19 days.

(21) Appl. No.: 12/239,941

(22) Filed: Sep. 29, 2008

(65) Prior Publication Data

US 2009/0085790 A1 Apr. 2, 2009

(30) Foreign Application Priority Data

Sep. 28, 2007 (KR) ...................... 10-2007-0098146

(51) Int. Cl.
*H03M 1/12* (2006.01)

(52) U.S. Cl. ...................................... 341/161; 341/155

(58) Field of Classification Search ................. 341/155, 341/144, 161, 172
See application file for complete search history.

(56) References Cited

U.S. PATENT DOCUMENTS

| | | | |
|---|---|---|---|
| 5,606,320 A | | 2/1997 | Kleks |
| 6,259,392 B1 * | | 7/2001 | Choi et al. .................. 341/150 |
| 6,486,820 B1 * | | 11/2002 | Allworth et al. ............ 341/161 |
| 6,801,151 B1 * | | 10/2004 | Opris ......................... 341/161 |
| 6,844,840 B1 * | | 1/2005 | Melanson .................... 341/161 |
| 6,914,550 B2 * | | 7/2005 | Cai ............................ 341/155 |
| 6,967,611 B2 * | | 11/2005 | Atriss et al. ................. 341/172 |
| 7,068,202 B2 * | | 6/2006 | Waltari ....................... 341/155 |
| 7,515,086 B2 * | | 4/2009 | Ryu ........................... 341/161 |
| 7,522,085 B1 * | | 4/2009 | Srinvasa et al. ............. 341/161 |
| 2008/0198058 A1 * | | 8/2008 | Watson et al. ............... 341/161 |

FOREIGN PATENT DOCUMENTS

| KR | 100285064 B1 | 12/2000 |
|---|---|---|
| KR | 1020040033630 A | 4/2004 |

* cited by examiner

*Primary Examiner*—Peguy JeanPierre
(74) *Attorney, Agent, or Firm*—F. Chau & Associates, LLC (57) ABSTRACT

A pipeline analog-to-digital converter includes a conversion unit receiving an analog input signal and outputting a plurality of digital signals corresponding to quantization values obtained by quantizing the input signal, the conversion unit including a plurality of stages that output the plurality of digital signals, the plurality of stages being connected in a cascade manner, each of the stages receiving a residue analog signal from a previous stage, and a first stage receiving an analog input signal and a digital correction logic receiving the plurality of digital signals, correcting an error, and outputting a digital output signal corresponding to the input signal, wherein a first reference voltage is applied to the plurality of stages, a second reference voltage, which is different from the first reference voltage, is applied to at least one of the plurality of stages, at least one of the plurality of stages includes a plurality of unit capacitors that sample the residue analog signal, and at least one of the plurality of unit capacitors is coupled to the second reference voltage.

15 Claims, 9 Drawing Sheets

| | C1 | C2 | C3 | C4 | C5 | C6 | C7 | C8 | C9 |
|---|---|---|---|---|---|---|---|---|---|
| 111 | F/B | Vref | Vref | Vref | Vref | Vref | Vref | Vref | F/B |
| 110 | GND | F/B | Vref | Vref | Vref | Vref | Vref | Vref | F/B |
| 101 | GND | GND | F/B | Vref | Vref | Vref | Vref | Vref | F/B |
| 100 | GND | GND | GND | F/B | Vref | Vref | Vref | Vref | F/B |
| 011 | GND | GND | GND | GND | F/B | Vref | Vref | Vref | F/B |
| 010 | GND | GND | GND | GND | GND | F/B | Vref | Vref | F/B |
| 001 | GND | GND | GND | GND | GND | GND | F/B | Vref | F/B |
| 000 | GND | GND | GND | GND | GND | GND | GND | F/B | F/B |

|     | C1     | C2   | C3   | C4   | C5   | C6   | C7   | C8  |
|-----|--------|------|------|------|------|------|------|-----|
| 100 | Vref/2 | F/B  | Vref | Vref | Vref | Vref | Vref | F/B |
| 011 | Vref/2 | GND  | F/B  | Vref | Vref | Vref | Vref | F/B |
| 010 | Vref/2 | GND  | GND  | F/B  | Vref | Vref | Vref | F/B |
| 001 | Vref/2 | GND  | GND  | GND  | F/B  | Vref | Vref | F/B |
| 000 | Vref/2 | GND  | GND  | GND  | GND  | F/B  | Vref | F/B |
| 111 | Vref/2 | GND  | GND  | GND  | GND  | GND  | F/B  | F/B |

PIPELINE ANALOG-TO-DIGITAL CONVERTER AND METHOD OF DRIVING THE SAME

CROSS REFERENCE TO RELATED APPLICATION

This application claims priority from Korean Patent Application No. 10-2007-0098146 filed on Sep. 28, 2007 in the Korean Intellectual Property Office, the disclosure of which is incorporated herein by reference in its entirety.

BACKGROUND OF THE INVENTION

1. Technical Field

The present disclosure relates to a pipeline analog-to-digital converter and a method of driving the same.

2. Discussion of Related Art

In recent years, with the development of digital technologies, an analog-to-digital converter (ADC) has been widely used in high definition TVs, mobile multimedia devices, and wireless communication devices. Various analog-to-digital converters, such as flash analog-to-digital converters and pipeline analog-to-digital converters, have been used. In particular, the pipeline analog-to-digital converter, which includes a plurality of stages connected in series to each other, has been mainly used because high data throughput, reduction in chip area, and low power consumption are realized.

As the design rule is reduced, however, a high-gain amplifier is needed, which makes it difficult to design a high-resolution pipeline analog-to-digital converter.

SUMMARY OF THE INVENTION

An exemplary embodiment of the present invention provides a pipeline analog-to-digital converter that can realize a low power consumption and a high resolution.

An exemplary embodiment of the present invention provides a method of driving a pipeline analog-to-digital converter that can realize a low power consumption and a high resolution.

BRIEF DESCRIPTION OF THE DRAWINGS

Exemplary embodiments of the present invention will be understood in more detail from the following descriptions taken in conjunction with the attached drawings, in which.

DESCRIPTION OF EXEMPLARY EMBODIMENTS

A pipeline analog-to-digital converter according to exemplary embodiments of the present invention will be described with reference to FIGS. 1 to 7.

Figure 1:
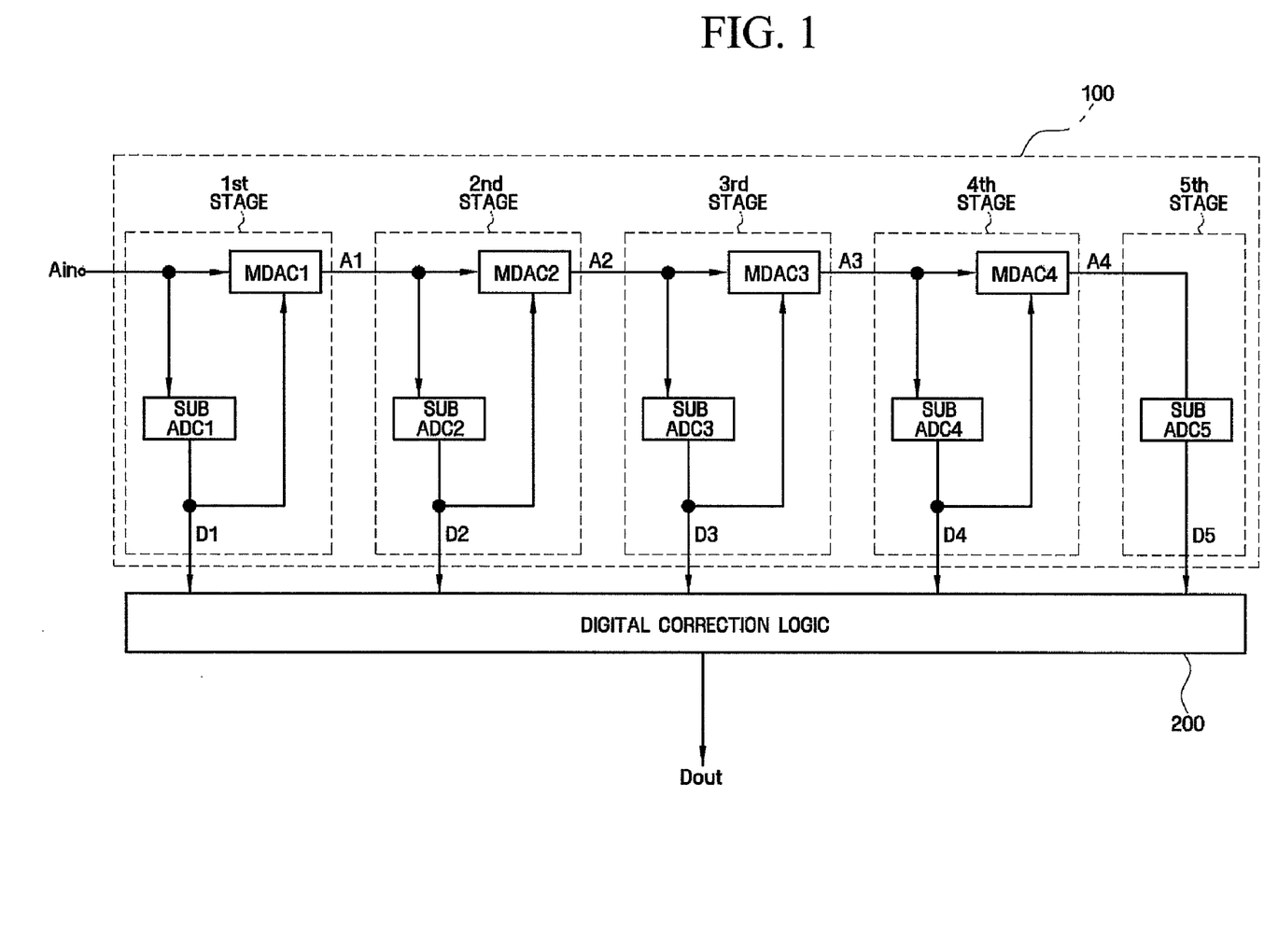
FIG. 1 is a block diagram showing a pipeline analog-to-digital converter according to an exemplary embodiment of the present invention.

FIG. 1 is a block diagram showing a pipeline analog-to-digital converter according to an exemplary embodiment of the present invention. In the exemplary embodiment, for explanatory convenience, a pipeline analog-to-digital converter includes five stages, each of which outputs a 12-bit digital output signal in response to an analog input signal, however, the present invention is not limited thereto.

Referring to FIG. 1, the pipeline analog-to-digital converter outputs a digital output signal Dout in response to an analog input signal Ain. The pipeline analog-to-digital converter includes a conversion unit 100 and a digital correction logic 200.

The conversion unit 100 transmits a plurality of digital signals D1 to D5 to the digital correction logic 200 in response to the input signal Ain. In this exemplary embodiment, the conversion unit 100 includes first to fifth stages, and to each of which is applied the same first reference voltage (not shown).

Excluding the fifth stage, each of the stages includes an MDAC (Multiplying Digital-to-Analog Converter) and a sub analog-to-digital converter.

The first stage, 1st STAGE, receives the input signal Ain and outputs an m-bit first digital signal D1 and a first residue analog signal A1. The first stage, 1st STAGE, includes a first sub analog-to-digital converter SUB ADC1 and a first MDAC, MDAC1.

The first sub analog-to-digital converter SUB ADC1 can apply the m-bit first digital signal D1 corresponding to a quantization value to the first MDAC, MDAC1, and to the digital correction logic 200 in response to the input signal Ain. The first sub analog-to-digital converter SUB ADC1 may be, for example, a flash analog-to-digital converter (flash ADC) that includes $2^m - 1$ comparators.

The first MDAC, MDAC1, compares an analog signal, which is obtained by converting the first digital signal D1 from the SUB ADC1, with the input signal Ain, amplifies the difference between the converted analog signal and the input signal Ain, and transmits the amplified difference to the second stage, 2nd STAGE, as the first residue analog signal A1.

A first MDAC according to an exemplary embodiment of the present invention will be described below in detail with reference to FIGS. 2 to 4.

Figure 2:
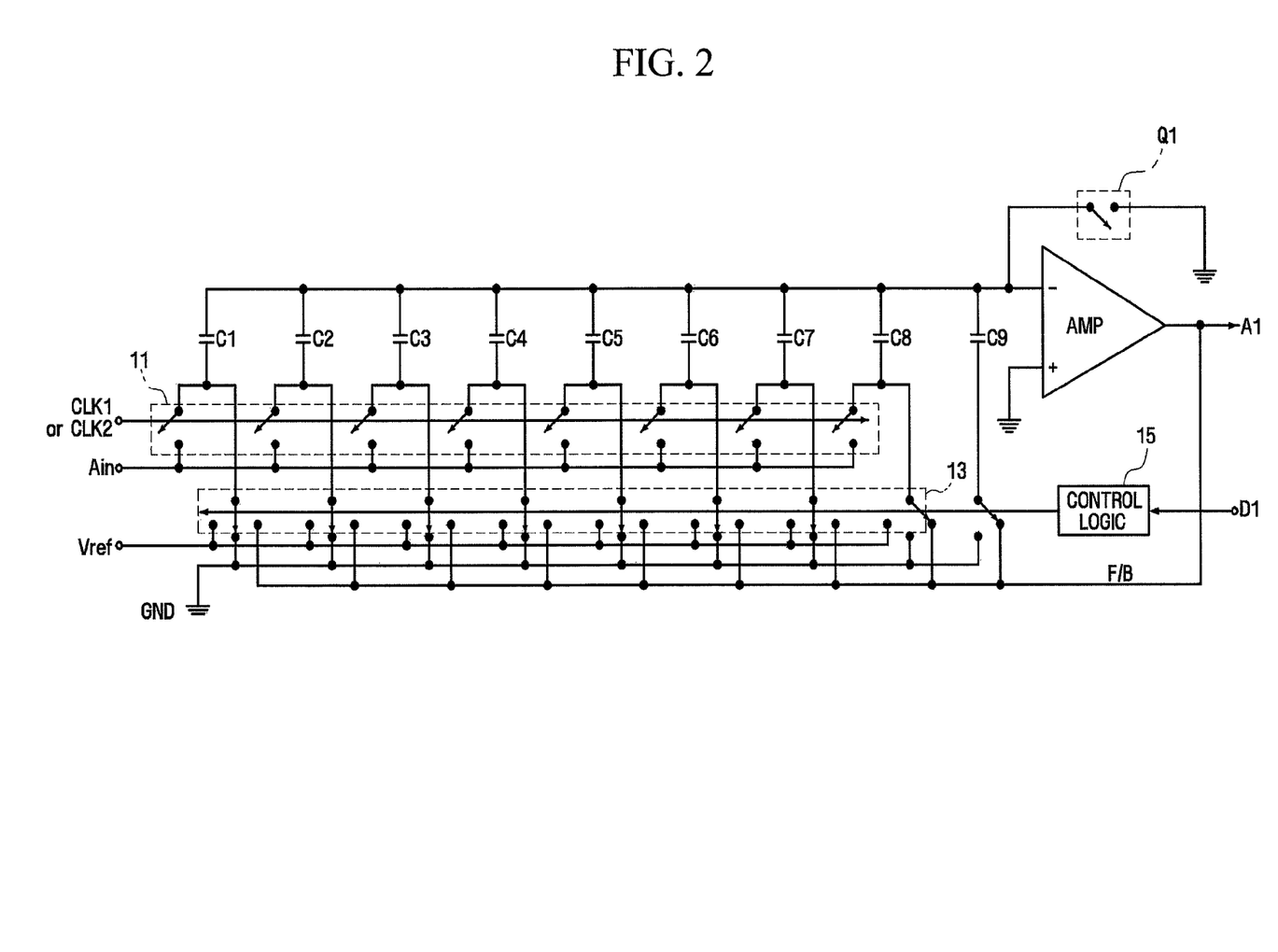
FIG. 2 is an exemplary circuit diagram showing a first Multiplying Digital-to-Analog Converter (MDAC) in a pipeline analog-to-digital converter according to an exemplary embodiment of the present invention.

FIG. 2 is an exemplary circuit diagram showing a first MDAC in a pipeline analog-to-digital converter according to an exemplary embodiment of the present invention. FIG. 3 is a diagram showing an exemplary unit capacitor array of a first MDAC in a pipeline analog-to-digital converter, according to an exemplary embodiment of the present invention. In this exemplary embodiment, for explanatory convenience, the first MDAC receives a 3-bit digital signal, however, the present invention is not limited thereto.

Referring to FIG. 2, the first MDAC, MDAC1, includes a first switch array 11, a second switch array 13, a plurality of unit capacitors C1 to C9, an amplifier AMP, and a control logic 15. The first MDAC, MDAC1, shown in FIG. 2 receives a first clock signal CLK1 at a high level and samples the input signal Ain with the first switch array 11. In addition, the first MDAC, MDAC1, receives a second clock signal CLK2 at a high level, compares the analog signal, which is obtained by converting the first digital signal D1, with the input signal Ain in the control logic 15, amplifies the difference between the analog signal and the input signal Ain in the amplifier AMP, and outputs the amplified difference as the first residue analog signal A1. In this exemplary embodiment, the first clock signal CLK1 and the second clock signal CLK2 may not overlap each other.

The first MDAC, MDAC1, receives the first clock signal CLK1 at the high level and samples the input signal Ain. Specifically, if the first clock signal CLK1 at the high level is received, the first switch array 11 is enabled, and the eight unit capacitors C1 to C8 sample the input signal Ain. In this exemplary embodiment, when the input signal Ain is sampled, a switch Q1 is enabled and the capacitors C1 to C8 are grounded.

The first MDAC, MDAC1, receives the second clock signal CLK2 at a high level, compares the analog signal, which is obtained by converting the first digital signal D1, with the input signal Ain in the control logic, amplifies the difference between the analog signal and the input signal Ain in the amplifier AMP, and outputs the amplified difference as the first residue analog signal A1. In this exemplary embodiment, when the first residue analog signal A1 is output, the switch Q1 is disabled in response to the second clock signal CLK2.

Specifically, the control logic 15 of the first MDAC, MDAC1, selectively enables the second switch array 13 in response to the first digital signal D1, and couples the plurality of unit capacitors C1-C8 to a first reference voltage Vref, a ground GND, or a feedback F/B.

Figure 3:
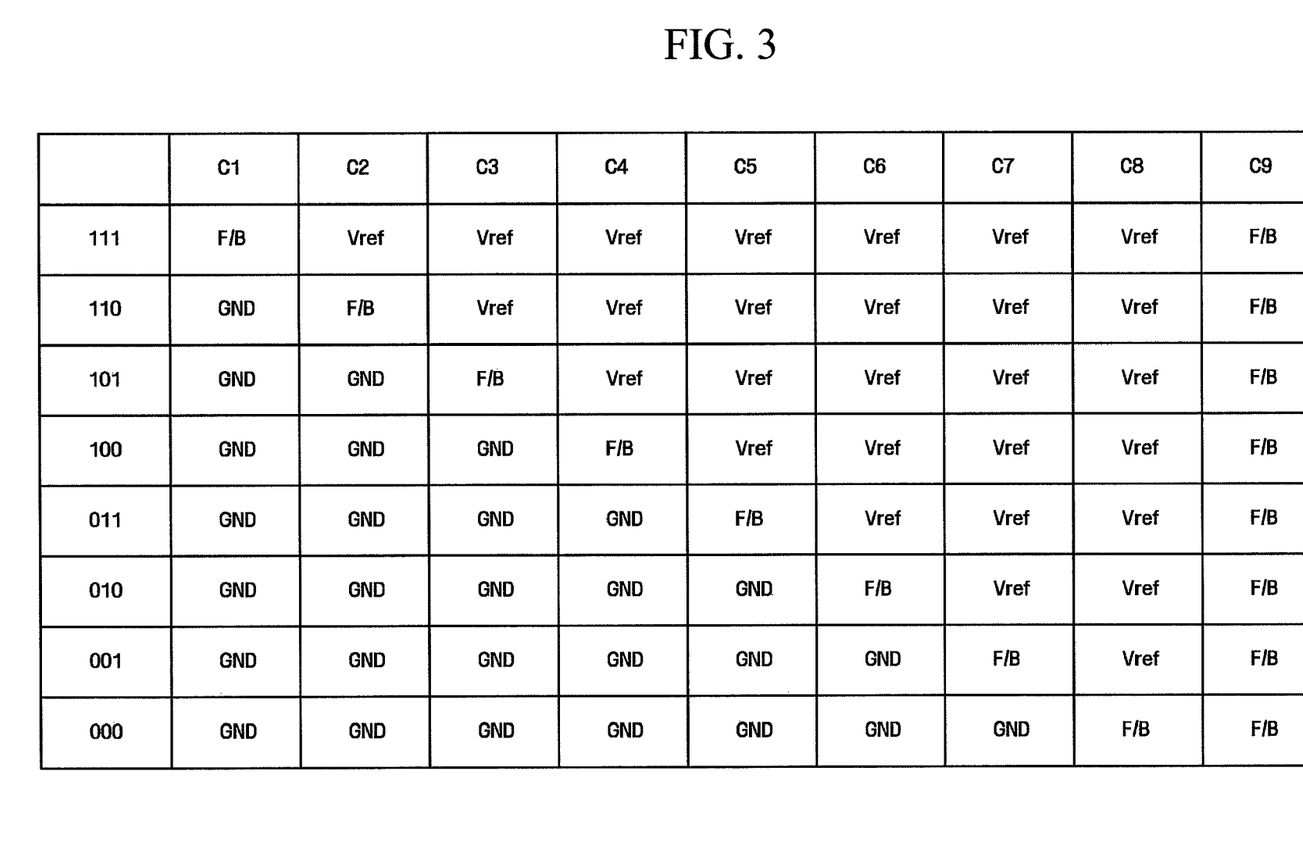
FIG. 3 is a diagram showing an exemplary unit capacitor array of a first MDAC in a pipeline analog-to-digital converter according to an exemplary embodiment of the present invention.

Referring to FIG. 3, the unit capacitor C9 is always coupled to the feedback F/B as a fixed feedback unit capacitor, as shown in FIG. 2. The other unit capacitors C1 to C8 may be selectively coupled to the first reference voltage Vref, the ground GND or the feedback F/B. In this exemplary embodiment, one of the unit capacitors C1 to C8 is used as a variable feedback unit capacitor to improve the linearity of the pipeline analog-to-digital converter.

The first MDAC, MDAC1, compares the analog signal, which is obtained by converting the first digital signal D1, with the input signal Ain, causes the amplifier AMP to amplify the difference between the analog signal and the input signal Ain $2^k$ times (for example, $2^2$ times), and outputs the amplified difference as the first residue analog signal A1. In this case, k is smaller than m, which is the number of bits of the first digital signal D1.

The DC gain, which is provided by the amplifier AMP, is generally represented by Equation 1.

$$\frac{2^k}{1+(1+2^k+\alpha_p)/A_0} \geq 2^k(1-2^{-(N-m)}) \quad (1)$$

In this case, $2^k$ denotes an inter-stage gain, $A_0$ denotes a DC gain of the amplifier AMP, $\alpha_p$ denotes a ratio of summing node parasitic capacitance to feedback capacitance, $2^N$ denotes accuracy of input, and m denotes stage resolution. In addition, m, which denotes the stage resolution, is the number of bits of the digital signal that is output from a corresponding stage. N, which denotes the accuracy of the input, is the number of bits of the digital output signal that is output from the pipeline analog-to-digital converter.

In addition, because the parasitic capacitance is much smaller than the feedback capacitance, if Equation 1 is summarized for the DC gain $A_0$ while ignoring $\alpha_p$, Equation 2 is obtained.

$$A_0 \geq 2^{(N+k-m)} \quad (2)$$

When the pipeline analog-to-digital converter outputs a 12-bit digital output signal Dout in response to the input signal Ain, the minimum DC gain, which is provided by the amplifier AMP, is 6(12+k−m) dB. That is, in the pipeline analog-to-digital converter, the minimum DC gain that is provided by the amplifier AMP is 6(m−k) dB, which is smaller than the minimum DC gain when m and k are the same. For example, the minimum DC gain, which is provided by the amplifier AMP of the first MDAC, MDAC1, may be 6 dB, which is smaller than the minimum DC gain when m and k are the same.

Figure 4:
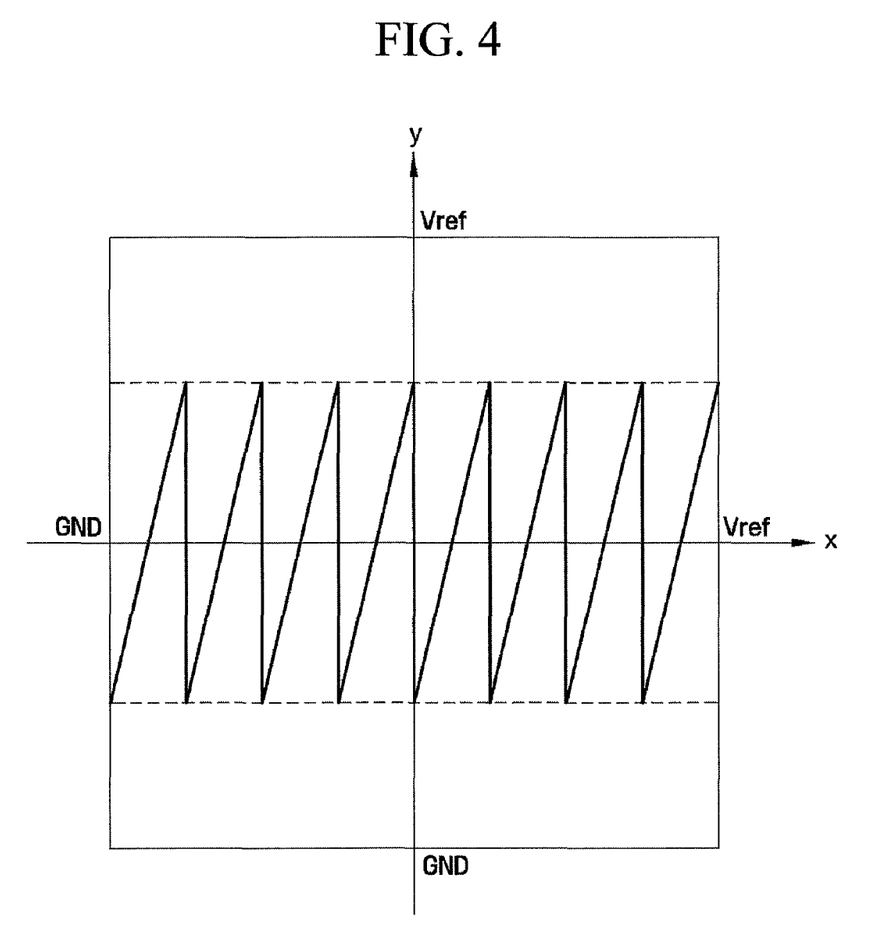
FIG. 4 is a diagram showing input/output transmission characteristics of a first MDAC in a pipeline analog-to-digital converter according to an exemplary embodiment of the present invention.

FIG. 4 is a diagram showing input/output transmission characteristics of a first MDAC in a pipeline analog-to-digital converter according to an exemplary embodiment of the present invention, in which the x-axis represents an input signal, and the y-axis represents an output signal.

Referring to FIG. 4, it can be understood that, from the input/output transmission characteristics of the first MDAC, MDAC1, the swing range of the first residue analog signal A1, which is output from the first MDAC, MDAC1, is lower than the swing range of the input signal Ain, which is output from the first MDAC, MDAC1. That is, the swing level of the input signal Ain can be expanded while the swing level of the first residue analog signal A1 can be adjusted to a stable output range of the amplifier AMP without loss.

As shown in FIG. 1, the second stage 2nd STAGE receives the first residue analog signal A1 from the first stage 1st STAGE, and outputs a second digital signal D2 and a second residue analog signal A2. The second stage 2nd STAGE includes a second sub analog-to-digital converter SUB ADC2 and a second MDAC, MDAC2.

Figure 7:
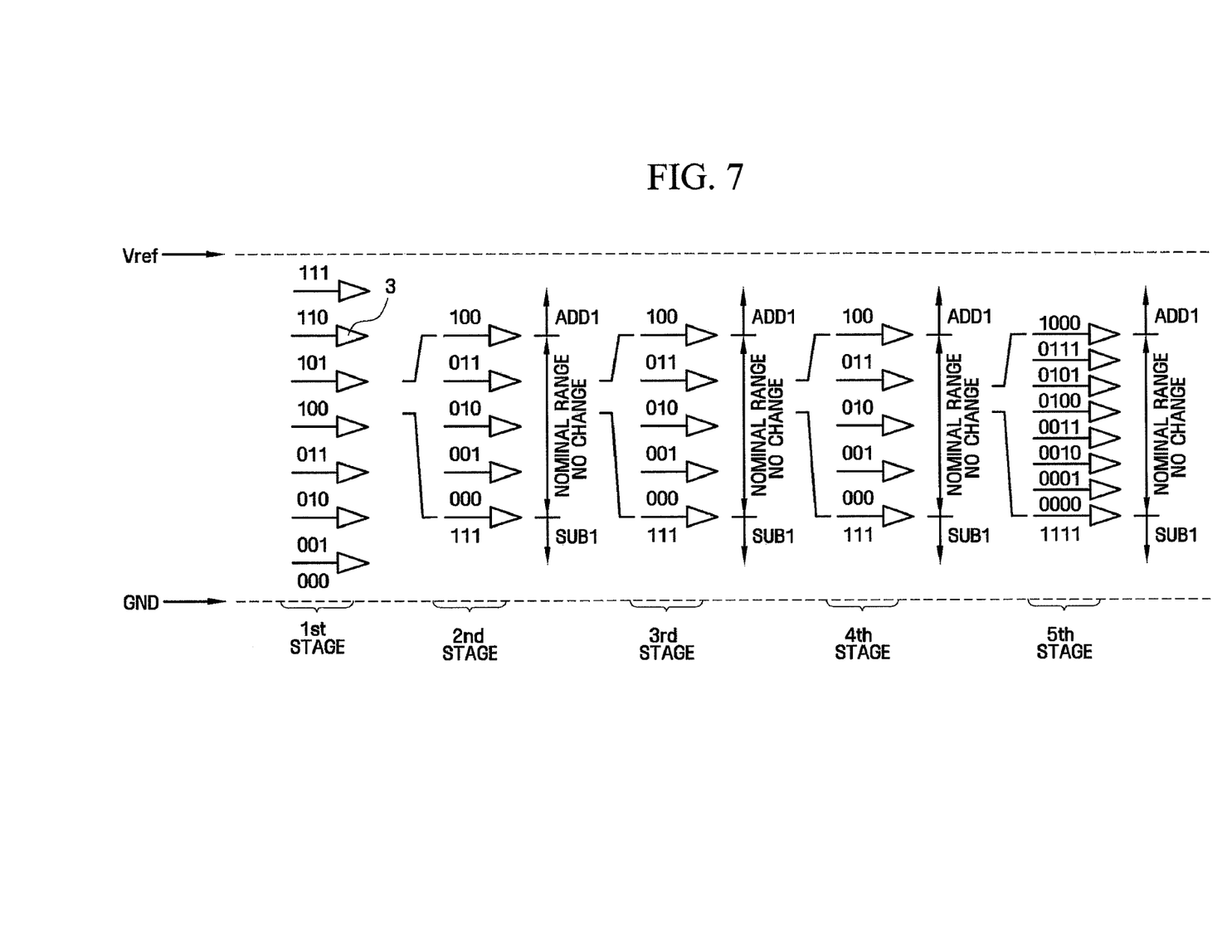
FIG. 7 is a diagram illustrating a coding method in a pipeline analog-to-digital converter according to an exemplary embodiment of the present invention.

The second sub analog-to-digital converter SUB ADC2 outputs the second digital signal D2 corresponding to a quantization value to the second MDAC, MDAC2, and the digital correction logic 200 in response to the first residue analog signal A1. The second digital signal D2 may have (k+1) bits and ($2^k$+2) levels. For example, the second digital signal D2 may have 3 bits and 6 levels. In this case, each level of the digital signal corresponds to each code (for example, 111, 110, . . . ) of the digital signal, as shown in FIG. 3.

In this exemplary embodiment, among the ($2^k$+2) levels of the second digital signal D2, $2^k$ levels are actually used as a signal that corresponds to the quantization value, and 2 levels are used as an error-correction signal. In this case, the $2^k$ levels, which are used as the signal corresponding to the quantization value, may fall within a nominal range shown in FIG. 7. The 2 levels that are used as the error-correction signal may fall within correction ranges ADD1 and SUB1 shown in FIG. 7. For example, $2^2$ levels of the second digital signal D2 may fall within the nominal range, and the 2 levels thereof may be used as the error-correction signal.

The second sub analog-to-digital converter SUB ADC2 may be, for example, a flash analog-to-digital converter that includes $2^k$+1 comparators.

The second MDAC, MDAC2, compares the analog signal, which is obtained by converting the second digital signal D2, with the first residue analog signal A1, amplifies the difference between the analog signal and the first residue analog signal A1, and outputs the amplified difference to the third stage 3rd STAGE as the second residue analog signal A2.

A second MDAC according to an exemplary embodiment of the present invention will be described below in detail with reference to FIGS. 5 and 6.

Figure 5:
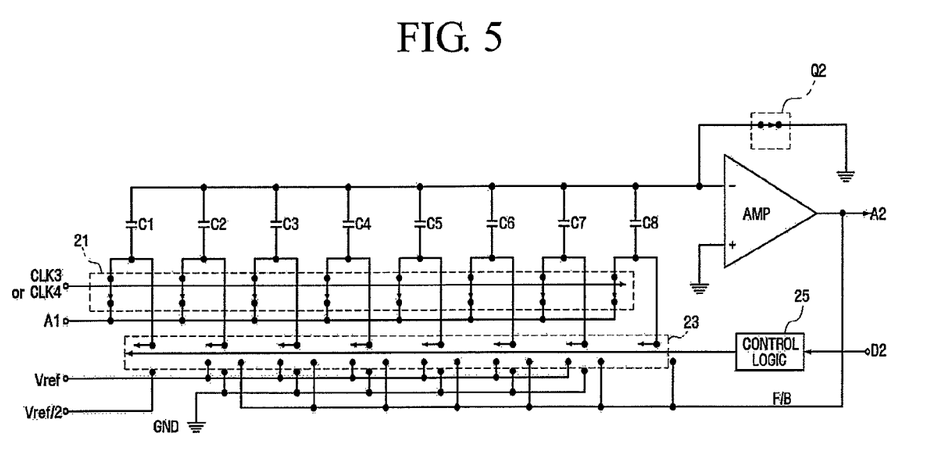
FIG. 5 is an exemplary circuit diagram showing a second MDAC in a pipeline analog-to-digital converter according to an exemplary embodiment of the present invention.

FIG. 5 is a circuit diagram showing a second MDAC in a pipeline analog-to-digital converter according to an exemplary embodiment of the present invention. FIG. 6 is a diagram showing a unit capacitor array of a second MDAC in a pipeline analog-to-digital converter according to an exemplary embodiment of the present invention.

Referring to FIG. 5, the second MDAC, MDAC2, includes a first switch array 21, a second switch array 23, a plurality of unit capacitors C1 to C8, an amplifier AMP, and a control logic 25. The second MDAC, MDAC2, receives a third clock signal CLK3 at a high level and samples the first residue analog signal A1. In addition, the second MDAC, MDAC2, receives a fourth clock signal CLK4 at a high level, compares the analog signal, which is obtained by converting the second digital signal D2, with the first residue analog signal A1, amplifies the difference between the analog signal and the first residue analog signal A1, and outputs the amplified difference as the second residue analog signal A2. In this exemplary embodiment, the third clock signal CLK3 may the same as the above-described second clock signal CLK2.

The second MDAC, MDAC2, receives the third clock signal CLK3 at the high level and samples the first residue analog signal A1. Specifically, if the third clock signal CLK3 at the high level is received, the first switch array 21 is enabled, and the eight unit capacitors C1 to C8 sample the first residue analog signal A1.

The second MDAC, MDAC2, receives the fourth clock signal CLK4 at the high level, compares the analog signal, which is obtained by converting the second digital signal D2, with the first residue analog signal A1, amplifies the difference between the analog signal and the second residue analog signal A1, and outputs the amplified difference as the second residue analog signal A2.

Specifically, the control logic 25 of the second MDAC, MDAC2, selectively enables the second switch array 23 in response to the second digital signal D2 and selectively couples the plurality of unit capacitors C1 to C8 to the first reference voltage Vref, the ground GND, or the feedback F/B.

Figure 6:
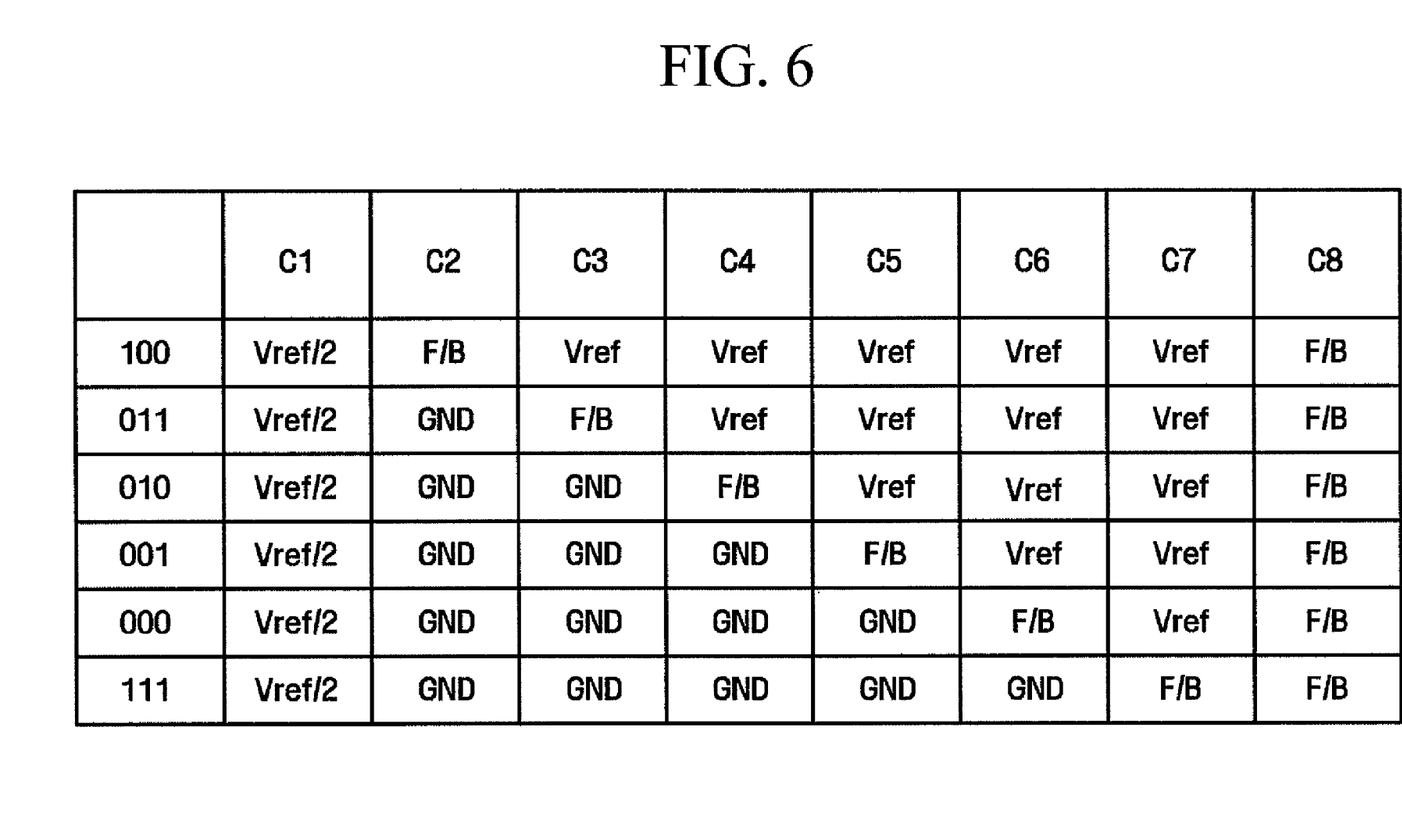
FIG. 6 is a diagram showing an exemplary unit capacitor array of a second MDAC in a pipeline analog-to-digital converter according to an exemplary embodiment of the present invention.

Referring to FIG. 6, among the plurality of unit capacitors C1 to C8, the six unit capacitors C2 to C7 are selectively coupled to the first reference voltage Vref, the ground GND, or the feedback F/B. The unit capacitor C8 is only coupled to the feedback F/B as a fixed feedback unit capacitor. The first unit capacitor C1 is coupled only to a second reference voltage Vref/2, thereby correcting the offset of an error correction bit. In this exemplary embodiment, the second reference voltage Vref/2 may be half the first reference voltage Vref.

The second MDAC, MDAC2, compares the analog signal, which is obtained by converting the second digital signal D2, with the sampled first residue signal A1, causes the amplifier AMP to amplify the difference between the analog signal and the sampled first residue signal A1 $2^k$ times (for example, $2^2$ times), and outputs the amplified difference as the second residue analog signal A2.

Accordingly, the magnitude of the quantized analog signal in the second stage 2nd STAGE may be the same as the magnitude of the quantized analog signal in the first stage 1st STAGE. For example, in the first stage 1st STAGE and the second stage 2nd STAGE, the magnitudes of the quantized analog signals may be equal to each other, for example, Vref/8. In this exemplary embodiment, the magnitude of the quantized analog signal may be the magnitude of the difference between the levels in the digital signal.

Similarly, a third sub analog-to-digital converter SUB ADC3 of the third stage 3rd STAGE outputs a third digital signal D3 corresponding to the quantization value to a third MDAC, MDAC3, and the digital correction logic 200 in response to the second residue analog signal A2. The third MDAC, MDAC3, compares the analog signal, which is obtained by converting the third digital signal D3, with the second residue analog signal A2, amplifies the difference between the analog signal and the second residue analog signal A2, and outputs the amplified difference to the fourth stage 4th STAGE as the third residue analog signal A3.

A fourth sub analog-to-digital converter SUB ADC4 of the fourth stage 4th STAGE outputs a fourth digital signal D4 corresponding to the quantization value to a fourth MDAC, MDAC4, and the digital correction logic 200 in response to the third residue analog signal A3. The fourth MDAC, MDAC4, compares the analog signal, which is obtained by converting the fourth digital signal D4, with the third residue analog signal A3, amplifies the difference between the analog signal and the third residue analog signal A3, and outputs the amplified difference to the fifth stage 5th STAGE as the fourth residue analog signal A4.

In this exemplary embodiment, the magnitudes of the quantized analog signals in the first to fourth stages may be the same.

The fifth stage 5th STAGE outputs a fifth digital signal D5 corresponding to the quantization value to the digital correction logic 200 in response to the fourth residue analog signal A4. The fifth stage 5th STAGE only includes a fifth sub analog-to-digital converter SUB ADC5, unlike the first to fourth stages 1st STAGE to 4th STAGE. The fifth sub analog-to-digital converter SUB ADC5 outputs the fifth digital signal D5 that has four bits and ten levels. Here, eight levels of the fifth digital signal D5 are actually used as a signal corresponding to the quantization value, and two levels of the fifth digital signal D5 are used as an error-correction signal. In addition, the fifth sub analog-to-digital converter SUB ADC5 may be, for example, a flash analog-to-digital converter that includes nine comparators.

The digital correction logic 200 receives the plurality of digital signals D1 to D5 from the plurality of stages 1st STAGE to 5th STAGE. When an offset error occurs in a previous stage, for example, the 1st STAGE, the digital correction logic 200 corrects the offset error, and outputs the digital output signal Dout that corresponds to the analog input signal Ain.

The operation of the pipeline analog-to-digital converter according to an exemplary embodiment of the present invention will be described with reference to FIGS. 1 to 7.

FIG. 7 is a diagram illustrating a coding method in a pipeline analog-to-digital converter according to an exemplary embodiment of the present invention. In this exemplary embodiment, a comparator 3 may be provided in the sub analog-to-digital converter of each stage.

Referring to FIGS. 1 to 7, the first stage 1st STAGE outputs the 3-bit first digital signal D1 corresponding to the quantization value in response to the input signal Ain shown in FIG. 1. In addition, the first stage 1st STAGE compares the analog signal, which is obtained by converting the first digital signal D1, with the input signal Ain, amplifies the difference between the analog signal and the input signal Ain $2^2$ times, and outputs the amplified difference to the second stage 2nd STAGE as the first residue analog signal A1 shown in FIG. 1.

The second stage 2nd STAGE outputs the second digital signal D2 that has six levels and three bits. Four levels in the nominal range are actually used as a signal corresponding to the quantization value, and two levels in the correction ranges ADD1 and SUB1 are used as an error-correction signal. In this exemplary embodiment, the nominal range may be a range where the result of the previous stage is used as it is, because the offset error does not exist in the previous stage (for example, the 1st STAGE). In addition, each of the correction ranges ADD1 and SUB1 may be a range where, when the offset error exists in the previous stage, the offset error is detected in the next stage (for example, the 2nd STAGE), and the offset error is corrected. For example, the offset error may be corrected by interpolating the MSB (Most Significant Bits) of the second stage 2nd STAGE and the LSB (Least Significant Bits) of the first stage 1st STAGE.

The second stage 2nd STAGE compares the analog signal, which is obtained by converting the second digital signal D2, with the first residue analog signal A1, amplifies the difference between the analog signal and the first residue analog signal A1 $2^2$ times, and outputs the amplified difference to the third stage 3rd STAGE as the second residue analog signal A2. In this exemplary embodiment, the magnitudes of the quantized analog signals in the first stage 1st STAGE and the second stage 2nd STAGE may be the same.

Similarly, the third stage 3rd STAGE outputs the third digital signal D3 that has six levels and three bits. The third stage 3rd STAGE compares the analog signal, which is obtained by converting the third digital signal D3, with the second residue analog signal A2, amplifies the difference between the analog signal and the second residue analog signal A2 $2^2$ times, and outputs the amplified difference to the fourth stage 4th STAGE as the third residue analog signal A3.

The fourth stage 4th STAGE outputs the fourth digital signal D4 that has six levels and three bits. The fourth stage 4th STAGE compares the analog signal, which is obtained by converting the fourth digital signal D4, with the third residue analog signal A3, amplifies the difference between the analog signal and the third residue analog signal A3 $2^2$ times, and outputs the amplified difference to the fifth stage 5th STAGE as the fourth residue analog signal A4.

The fifth stage 5th STAGE outputs the fifth digital signal D5 that has ten levels and four bits.

The digital correction logic 200 receives the first to fifth digital signals D1 to D5 from the first to fifth stages 1st STAGE to 5th STAGE, and outputs the 12-bit digital output signal Dout.

A pipeline analog-to-digital converter according to an exemplary embodiment of the present invention is described below with reference to FIGS. 8 and 9.

Figure 8:
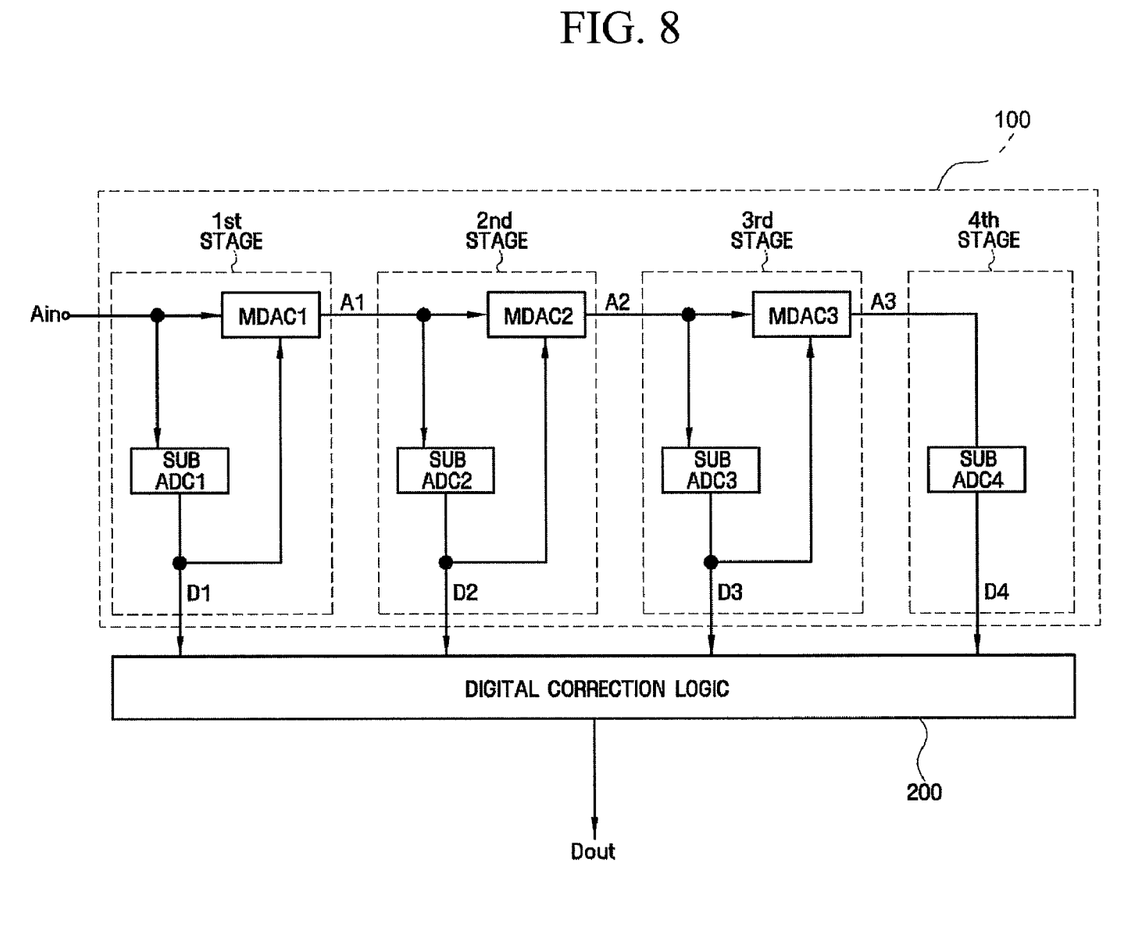
FIG. 8 is a block diagram showing a pipeline analog-to-digital converter according to an exemplary embodiment of the present invention.

FIG. 8 is a block diagram showing a pipeline analog-to-digital converter according to an exemplary embodiment of the present invention. FIG. 9 is a diagram illustrating a coding method in a pipeline analog-to-digital converter according to an exemplary embodiment of the present invention. The same parts, which perform the same functions as those shown in FIGS. 1 to 7, are represented by the same reference numerals, and the detailed descriptions thereof will be omitted. In this exemplary embodiment, for explanatory convenience, a pipeline analog-to-digital converter includes four stages, each of which outputs a 12-bit digital output signal in response to an analog input signal, however, the present invention is not limited thereto.

Figure 9:
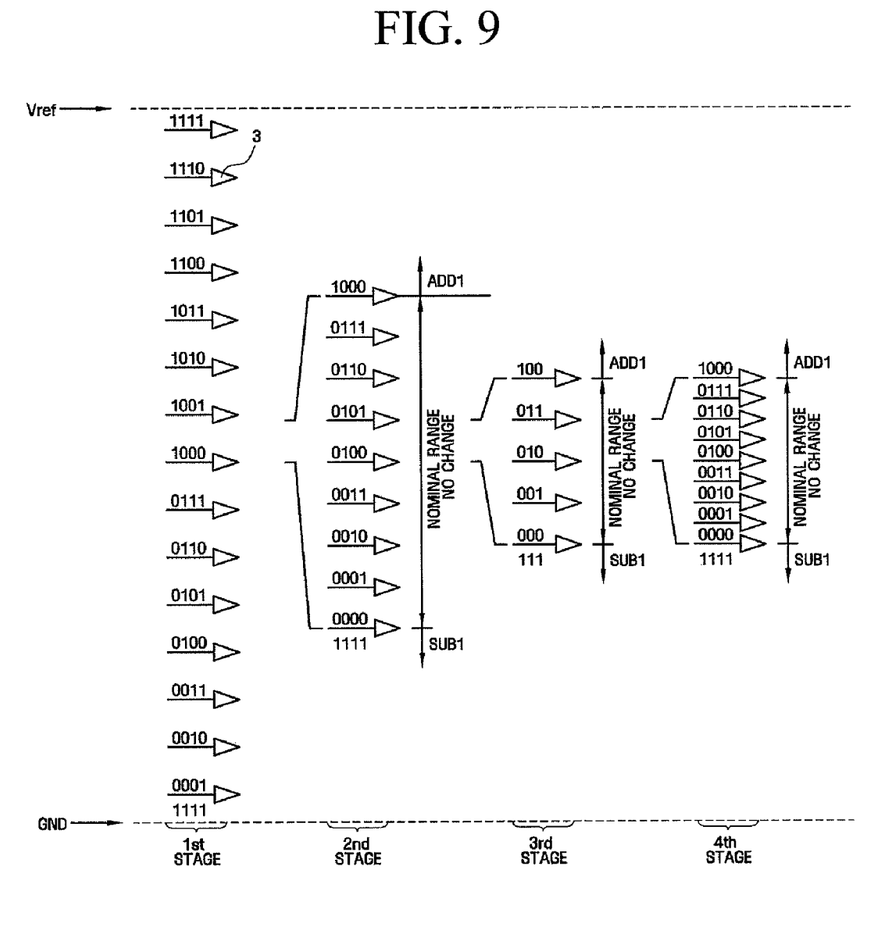
FIG. 9 is a diagram illustrating a coding method in a pipeline analog-to-digital converter according to an exemplary embodiment of the present invention.

Referring to FIGS. 8 and 9, the pipeline analog-to-digital converter according to an exemplary embodiment of the present invention is different from the previously described pipeline analog-to-digital converter in that, in the first stage 1st STAGE and the second stage 2nd STAGE, from $2^k$ of Equation 2 that indicates the inter-stage gain, k is smaller than m that indicates the stage resolution.

The first stage 1st STAGE outputs the 4-bit first digital signal D1 corresponding to the quantization value in response to the input signal Ain. The first MDAC, MDAC1, of the first stage 1st STAGE compares the analog signal, which is obtained by converting the first digital signal D1, with the input signal Ain, amplifies the difference between the analog signal and the input signal Ain $2^3$ times, and outputs the amplified difference to the second stage 2nd STAGE as the first residue analog signal A1. In this exemplary embodiment, the first analog-to-digital converter SUB ADC1 may be, for example, a flash analog-to-digital converter that includes fifteen comparators, shown typically at 3 in FIG. 9.

The second stage 2nd STAGE outputs the second digital signal D2 (ten levels and four bits) corresponding to the quantization value in response to the first residue analog signal A1. In this exemplary embodiment, the eight levels in the nominal range are actually used as a signal corresponding to the quantization value, and the two levels in the correction ranges ADD1 and SUB1 are used as an error-correction signal. The second sub analog-to-digital converter SUB ADC2 may be, for example, a flash analog-to-digital converter that includes nine comparators.

The second MDAC, MDAC2, of the second stage 2nd STAGE compares the analog signal, which is obtained by converting the second digital signal D2, with the first residue analog signal A1, amplifies the difference between the analog signal and the first residue analog signal A1 $2^2$ times, and outputs the amplified difference to the third stage 3rd STAGE as the second residue analog signal A2.

Similarly, the third stage 3rd STAGE outputs the third digital signal D3 (six levels and three bits) corresponding to the quantization value in response to the second residue analog signal A2. In this exemplary embodiment, four levels in the nominal range are actually used as a signal corresponding to the quantization value, and two levels in the correction ranges ADD1 and SUB1 are used as an error-correction signal. The third sub analog-to-digital converter SUB ADC3 may be, for example, a flash analog-to-digital converter that includes five comparators.

The third MDAC, MDAC3, of the third stage 3rd STAGE compares the analog signal, which is obtained by converting the third digital signal D3, with the second residue analog signal A2, amplifies the difference between the analog signal and the second residue analog signal A2 $2^2$ times, and outputs the amplified difference to the fourth stage 4th STAGE as the third residue analog signal A3.

In this exemplary embodiment, the magnitudes of the quantized analog signals in the first to third stages, 1st STAGE to 3rd STAGE, may be the same.

The fourth stage 4th STAGE outputs the fourth digital signal D4 (ten levels and four bits) corresponding to the quantization value in response to the third residue analog signal A3. In this exemplary embodiment, eight levels in the nominal range are actually used as a signal corresponding to the quantization value, and two levels in the correction ranges ADD1 and SUB1 are used as an error-correction signal. The fourth sub analog-to-digital converter SUB ADC4 may be, for example, a flash analog-to-digital converter that includes nine comparators.

The digital correction logic 200 shown in FIG. 8 receives the first to fourth digital signals, D1 to D4, from the first to fourth stages, 1st STAGE to 4th STAGE, corrects an error, and outputs the digital output signal Dout.

What is claimed is:

1. A pipeline analog-to-digital converter comprising:
a conversion unit receiving an analog input signal and outputting a plurality of digital signals corresponding to quantization values obtained by quantizing the analog input signal, the conversion unit including a plurality of stages that output the plurality of digital signals, the plurality of stages being connected in a cascade manner, each of the stages receiving a residue analog signal from a previous stage, and a first stage receiving the analog input signal; and a digital correction logic receiving the plurality of digital signals, correcting an error therein, and outputting a digital output signal corresponding to the analog input signal, wherein a first reference voltage is applied to the plurality of stages, wherein at least a second stage that follows the first stage includes a plurality of unit capacitors that sample the residue analog signal, and wherein a second reference voltage, which is different from the first reference voltage and from a ground voltage, is applied to a first unit capacitor of the second stage and not to other unit capacitors of the plurality of unit capacitors of the second stage.

2. The pipeline analog-to-digital converter of claim 1, wherein:

each of the stages of the conversion unit, excluding the last stage, comprises:

a sub analog-to-digital converter outputting an m-bit digital signal corresponding to a quantization value in response to a previous residue analog signal that is output from a previous stage or to the input signal; and a multiplying digital-to-analog converter (MDAC) amplifying a difference between an analog signal, which is obtained by converting the m-bit digital signal, and a previous residue analog signal or the input signal $2^k$ times, and outputting a current residue analog signal, wherein m is larger than k.

3. The pipeline analog-to-digital converter of claim 2, wherein the sub analog-to-digital converter of each stage, which receives the residue analog signal amplified $2^k$ times, comprises $2^k+1$ comparators.

4. The pipeline analog-to-digital converter of claim 2, wherein the MDAC of each stage, which receives the residue analog signal amplified $2^k$ times, comprises at least $2^m$ unit capacitors.

5. The pipeline analog-to-digital converter of claim 2, wherein a magnitude of a quantized analog signal in a current stage, which outputs the residue analog signal amplified $2^k$ times, is the same as a magnitude of a quantized analog signal in a next stage, which receives the residue analog signal amplified $2^k$ times.

6. The pipeline analog-to-digital converter of claim 1, wherein the second reference voltage is half the first reference voltage.

7. A pipeline analog-to-digital converter comprising:

first to n-th stages, where n is an integer, connected in a cascade manner, wherein each of the second to (n−1)th stages includes a sub analog-to-digital converter that outputs a digital signal corresponding to a quantization value in response to a previous residue analog signal output from a previous stage, and a multiplying digital-to-analog converter (MDAC) that outputs a current residue analog signal using the previous residue analog signal and the digital signal, wherein a swing range of the current residue analog signal is lower than a swing range of the previous residue analog signal, wherein a first reference voltage is applied to the first to n-th stages, wherein a first unit capacitor of the second stage and not other unit capacitors of the second stage of a plurality of unit capacitors of the MDAC in an h-th stage, where 1<h <n, and h is an integer, is further applied with a second reference voltage, which is different from the first reference voltage and from a ground voltage, without regard to the residue analog signal.

8. The pipeline analog-to-digital converter of claim 7, wherein the first stage comprises:

a sub analog-to-digital converter outputting a digital signal corresponding to a quantization value in response to an analog input signal; and an MDAC outputting a residue analog signal using the input signal and the digital signal.

9. The pipeline analog-to-digital converter of claim 8, wherein:

the sub analog-to-digital converter of a j-th stage, where 1≦j <n, and j is an integer, outputs an m-bit digital signal, the MDAC amplifies the difference between an analog signal, which is obtained by converting the m-bit digital signal, with the previous residue analog signal or the input signal $2^k$ times, and outputs a current residue analog signal to a (j+1)th stage, and m is larger than k.

10. The pipeline analog-to-digital converter of claim 9, wherein:

the sub analog-to-digital converter of the j-th stage includes $2^m-1$ comparators, and the sub analog-to-digital converter of the (j+1)th stage includes $2^k+1$ comparators.

11. The pipeline analog-to-digital converter of claim 8, wherein the MDAC of the (j+1)th stage comprises at least $2^m$ unit capacitors.

12. A method of driving a pipeline analog-to-digital converter, comprising:

causing a conversion unit to receive an analog input signal and to output a plurality of digital signals corresponding to quantization values obtained by quantizing the input signal; and causing a digital correction logic to receive the plurality of digital signals, to correct an error, and to output a digital output signal corresponding to the analog input signal, wherein the conversion unit includes first to n-th stages, where n is an integer, that are connected in a cascade manner, applying a first reference voltage to the first to n-th stages, applying a second reference voltage, which is different from the first reference voltage and from a ground voltage, to a first unit capacitor of a second stage that follows the first stage and that has a plurality of unit capacitors that sample a residue analog signal from the first stage, and not to other unit capacitors of the second stage, wherein each of the first to (n−1)th stages includes a sub analog-to-digital converter that outputs a digital signal corresponding to a quantization value in response to a previous residue analog signal output from a previous stage, and each of the first to n-th stages except a last one includes a multiplying digital-to-analog converter (MDAC) that outputs a current residue analog signal using the previous residue analog signal and the digital signal, and a swing range of the current residue analog signal is lower than a swing range of the previous residue analog signal.

13. The method of claim 12, wherein the first stage comprises:
- a sub analog-to-digital converter outputting a digital signal corresponding to a quantization value in response to an analog input signal; and
- an MDAC outputting a residue analog signal using the input signal and the digital signal.

14. The method of claim 13, wherein:
the sub analog-to-digital converter of a j-th stage, where $1 \leq j < n$, and j is an integer, outputs an m-bit digital signal, and the MDAC amplifies the difference between an analog signal, which is obtained by converting the m-bit digital signal, and the previous residue analog signal or the input signal $2^k$ times, and outputs a current residue analog signal to a (j+1)th stage, and wherein m is larger than k.

15. The method of claim 14, wherein:
the sub analog-to-digital converter of the j-th stage includes $2^m-1$ comparators, and the sub analog-to-digital converter of the (j+1)th stage includes $2^k+1$ comparators.

* * * * *